United States Patent
Song et al.

(10) Patent No.: US 9,425,166 B2
(45) Date of Patent: Aug. 23, 2016

(54) GOA LAYOUT METHOD, ARRAY SUBSTRATE AND DISPLAY DEVICE

(71) Applicant: BOE Technology Group Co., Ltd., Beijing (CN)

(72) Inventors: Song Song, Beijing (CN); Kazuyoshi Nagayama, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 2 days.

(21) Appl. No.: 14/518,743

(22) Filed: Oct. 20, 2014

(65) Prior Publication Data

US 2016/0043055 A1 Feb. 11, 2016

(30) Foreign Application Priority Data

Aug. 11, 2014 (CN) .......................... 2014 1 0392563

(51) Int. Cl.
| H01L 29/40 | (2006.01) |
| H01L 25/065 | (2006.01) |
| H01L 25/00 | (2006.01) |
| H01L 23/538 | (2006.01) |

(52) U.S. Cl.
CPC ....... *H01L 25/0652* (2013.01); *H01L 23/5384* (2013.01); *H01L 23/5386* (2013.01); *H01L 25/50* (2013.01); *H01L 2225/06541* (2013.01); *H01L 2225/06562* (2013.01)

(58) Field of Classification Search
CPC ....... H01L 33/32; H01L 33/62; H01L 33/06; H01L 27/3244; H01L 51/0058
USPC .................................. 257/774; 438/107, 637
See application file for complete search history.

(56) References Cited

U.S. PATENT DOCUMENTS

| 2011/0170274 A1* | 7/2011 | Moriwaki | ........... G02F 1/13452 361/783 |
| 2011/0181557 A1* | 7/2011 | Kim et al. | ............ G02F 1/1362 345/204 |
| 2014/0353844 A1* | 12/2014 | Ma | ........................ H01L 27/124 257/774 |

* cited by examiner

*Primary Examiner* — Andy Huynh
(74) *Attorney, Agent, or Firm* — Banner & Witcoff, Ltd.

(57) ABSTRACT

A GOA layout method, an array substrate and a display device are provided. The array substrate includes a plurality of GOA unit groups, each of which includes two adjacent GOA units. The plurality of GOA unit groups includes a first GOA unit group, two GOA units of the first GOA unit group have an overlapping region with at least one via hole provided therein, and the two GOA units of the first GOA unit group are electrically connected through the at least one via hole. With the array substrate, the density of gate lines can be increased.

20 Claims, 4 Drawing Sheets

GOA LAYOUT METHOD, ARRAY SUBSTRATE AND DISPLAY DEVICE

This application claims priority to Chinese Patent Application No. 201410392563.X, filed on Aug. 11, 2014. The present application claims priority to and the benefit of the above-identified application and is incorporated herein in its entirety.

TECHNICAL FIELD

At least one embodiment of the present invention relates to a GOA layout method, an array substrate and a display device.

BACKGROUND

TFT-LCDs (Thin Film Transistor Liquid Crystal Displays) are common liquid crystal display products at present. In a TFT-LCD, each of pixels is usually provided with a thin film transistor, and the thin film transistor of each pixel is connected to a corresponding gate drive circuit, so as to control the change of liquid crystal transmittance within the pixel, and then to control the change of pixel color. GOA (Gate Driver on Array) circuit technology is a commonly-used gate drive circuit technology in TFT-LCDs at present. In this technology, a gate drive circuit is directly manufactured on an array substrate, so that a gate drive integrated circuit portion is omitted to reduce costs.

SUMMARY

At least one embodiment of the invention provides a GOA layout method, an array substrate and a display device, so as to increase the density of gate lines.

At least one embodiment of the invention provides an array substrate, which comprises a plurality of GOA unit groups, each of which includes two adjacent GOA units. The plurality of GOA unit groups includes a first GOA unit group, two GOA units of the first GOA unit group comprise an overlapping region with at least one via hole provided therein, and the two GOA units of the first GOA unit group are electrically connected through the at least one via hole. For example, at least two via holes are provided in the overlapping region.

For example, wiring portions of the two GOA units of the first GOA unit group overlap with each other in the overlapping region.

For example, one GOA unit or two GOA units of the first GOA unit group may be placed in an oblique mode.

For example, the plurality of GOA unit groups may further include a second GOA unit group, and two GOA units of the second GOA unit group are electrically connected through a conducting wire.

For example, the obliquely-placed GOA unit or units may be connected to a curved conducting wire.

For example, a sectional shape and/or a planar shape of the GOA units may be a folded-line shape. For example, the folded-line shape may be a concave shape or an L shape.

At least one embodiment of the invention further provides another array substrate, which comprises a plurality of GOA units, and the plurality of GOA units is placed obliquely.

For example, each of the obliquely-placed GOA units and adjacent GOA unit thereof are electrically connected through a conducting wire or a via hole; or each of the obliquely-placed GOA unit and adjacent GOA units thereof are electrically connected through a conducting wire and a via hole.

For example, the array substrate may further include, a curved conducting wire connected to the obliquely-placed GOA units.

At least one embodiment of the invention further provides a display device, which comprises an array substrate as stated in any of above-mentioned items.

At least one embodiment of the invention further provides a GOA layout method, which comprises: providing a plurality of GOA unit groups, each of which includes two adjacent GOA units, the plurality of GOA unit groups includes a first GOA unit group, two GOA units of the first GOA unit group comprise an overlapping region with at least one via hole provided therein, and electrically connecting the two GOA units of the first GOA unit group through the at least one via hole.

For example, at least two via holes are provided in the overlapping region.

For example, the method may further comprise: obliquely placing one GOA unit or two GOA units of the first GOA unit group.

For example, the plurality of GOA unit groups may further include a second GOA unit group, and two GOA units of the second GOA unit group are electrically connected through a conducting wire.

For example, the method may further include: connecting the obliquely-placed GOA unit or units to a curved conducting wire.

BRIEF DESCRIPTION OF THE DRAWINGS

In order to clearly illustrate the technical solution of the embodiments of the invention, the drawings of the embodiments will be briefly described in the following; it is obvious that the described drawings are only related to some embodiments of the invention and thus are not limitative of the invention.

DETAILED DESCRIPTION

In order to make objects, technical details and advantages of the embodiments of the invention apparent, the technical solutions of the embodiments of the invention will be described in a clearly and fully understandable way in connection with the drawings related to the embodiments of the invention. Apparently, the described embodiments are just a part but not all of the embodiments of the invention. Based on the described embodiments herein, those ordinarily skilled in the art can obtain other embodiment(s), without any inventive work, which should be within the scope of the invention.

Unless otherwise defined, all the technical and scientific terms used herein have the same meanings as commonly understood by one of ordinary skill in the art to which the present invention belongs. The terms "first," "second," etc., which are used in the description and the claims of the present application for invention, are not intended to indicate any sequence, amount or importance, but distinguish various components. Also, the terms such as "a," "an," etc., are not intended to limit the amount, but indicate the existence of at least one. The terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

Figure 1:
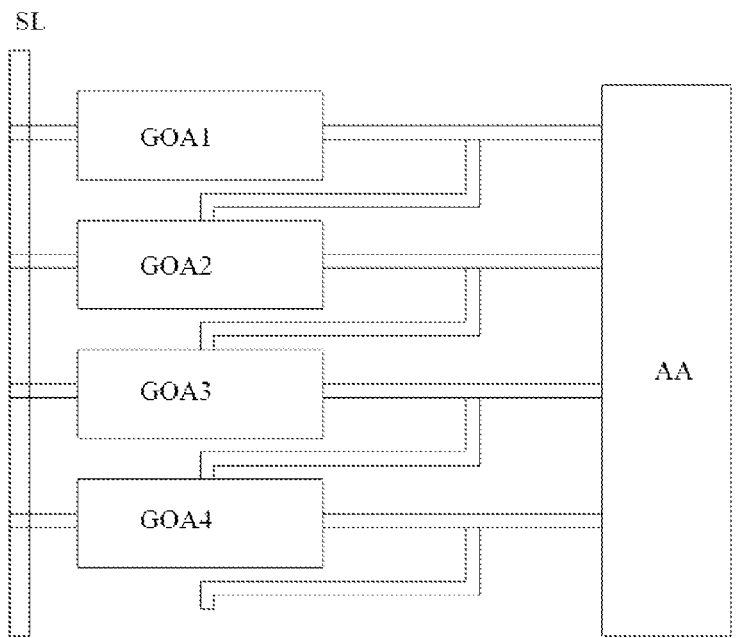
FIG. 1 is a schematic view illustrating a GOA layout structure.

FIG. 1 is a schematic view illustrating a GOA layout structure. As shown in FIG. 1, a GOA circuit is located at an edge of a display panel outside its display area (AA area), and includes a signal line SL and a plurality of GOA units. An output end of each of the GOA units is connected to a gate line, which is connected to a row of pixels in the display area of the display panel, namely, each of the GOA units corresponds to a row of pixels of a TFT-LCD; besides, the output end of each of the GOA units is further connected to an input end of a next GOA unit through a conducting wire, so as to turn on the next GOA unit. In the work process of the TFT-LCD, a gate drive voltage is supplied to every row of pixels successively, so the GOA units corresponding to every row of pixels need to start to work successively.

In the GOA layout structure shown in FIG. 1, each of GOA units corresponds to a gate line, so the number and arrangement of gate lines are limited by the number and arrangement of GOA units. This makes the improvement in the resolution of a corresponding display device be restricted.

In at least one embodiment of the invention, a via hole is used to connect adjacent GOA units, so that the GOA units may overlap with each other. Thereby, the arrangement density of GOAs is increased without reduction in the area of a GOA itself, so as to increase the intensity of gate lines, and thus to realize the improvement in the display resolution without the necessity of changing the number of gate lines corresponding to the GOA units.

At least one embodiment of the invention provides an array substrate. The array substrate includes a plurality of GOA unit groups, each of which includes two adjacent GOA units. The plurality of GOA unit groups includes a first GOA unit group, and two GOA units of the first GOA unit group have an overlapping region with at least one via hole provided therein, and the two GOA units of the first GOA unit group are electrically connected through the at least one via hole. In embodiments of the invention, because adjacent GOA units are electrically connected with each other by using the via hole, as compared with the mode in which a conducting wire is used for the electric connection, GOA units may overlap with each other, and thereby the area occupied by GOAs is reduced. Then, the density of gate lines can be increased, and in turn, the display resolution is improved.

In the GOA layout structure shown in FIG. 1, GOA units in the (n+1)th row only can begin to work after they receive a trigger signal from GOA units in the nth row. When a normal output cannot be carried out by GOA units in a certain row because of the occurrence of an abnormal situation, GOA units in the next row cannot work normally, either, and thus the following GOA units cannot work normally, either, which makes the liquid crystal display incapable of performing a normal display.

In an array substrate provided by at least one embodiment of the invention, at least two via holes can be provided in the overlapping region. Because at least two via holes may be employed for the connection between adjacent GOA units, when a via hole is damaged under the action of an external force, the adjacent GOA units may also be electrically connected with each other through other via hole. As compared with the mode in which a conducting wire is used for connection, this supplements the connection path between the adjacent GOA units, and thereby the stability of a display panel is improved. For example, in a flexible display screen, at least two via holes may be employed for the connection between adjacent GOA units, so that the anti-bending capability of the GOA units is enhanced, and then, the anti-bending capability of the flexible display screen is enhanced.

Figure 2:
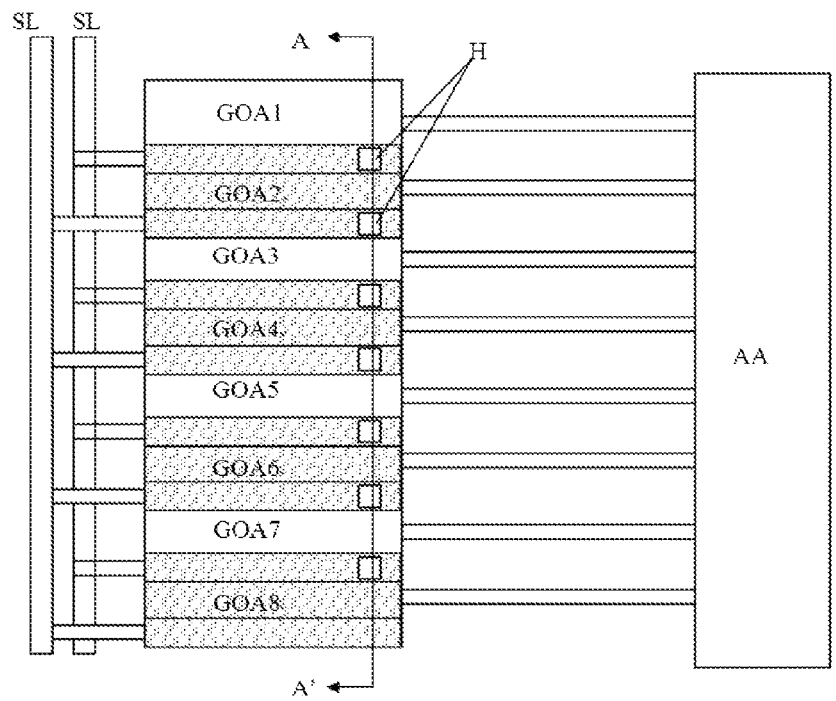
FIG. 2 is a schematic view illustrating a GOA layout structure of an array substrate provided by an embodiment of the invention.
Figure 4:
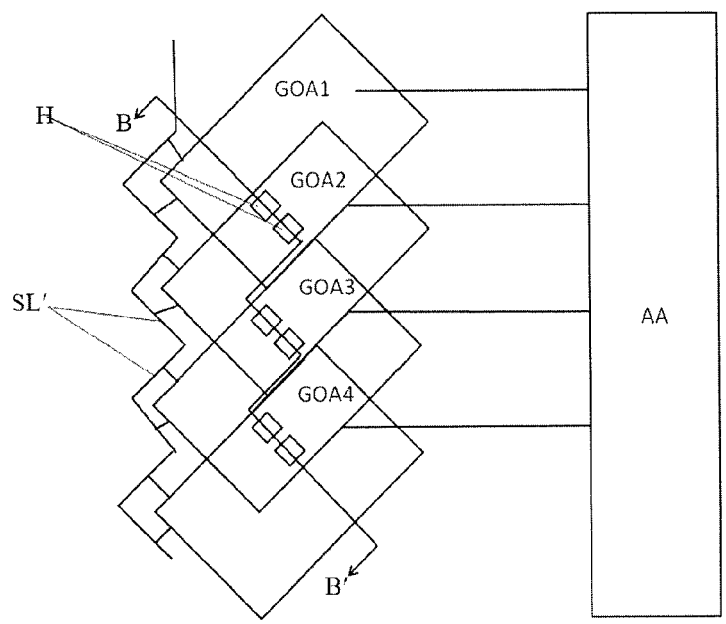
FIG. 4 is a schematic view illustrating a GOA layout structure of an array substrate provided by another embodiment of the invention.

In an embodiment, the at least two via holes may be arranged in line along a wiring portion of the GOA units, and for example, more via holes may be set on the left side of each via hole H as shown in FIG. 2 in a direction parallel to gate lines. In an embodiment, the at least two via holes may also be set in the direction of a connecting line for two GOA units connected by them, and for example, two via holes H as shown in FIG. 4 are set in the direction of a connecting line for two GOA units connected by them. Of course, embodiments of the invention are not limited thereto.

Figure 3:
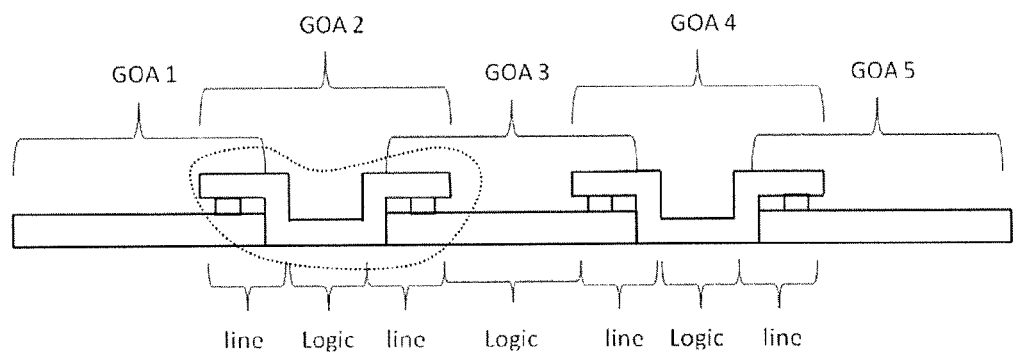
FIG. 3 is a sectional view of the GOA layout structure shown in FIG. 2, taken along the direction of A-A'.

In an embodiment, two GOA units of the first GOA unit group have an overlapping region, and this may include the following cases. Wiring portions for the two GOA units of the first GOA unit group overlap with each other. Each of the GOA units includes a wiring portion and a logic portion, the logic portion mainly includes devices such as a TFT and the like, and the wiring portion includes connecting wires for connecting these devices to the exterior. In an example, as shown in FIG. 2 and FIG. 3, the wiring portion of each GOA unit can be divided into two parts, and these two parts are located on two sides of the logic portion, respectively. Every two adjacent GOA units form one first GOA unit group, for example, GOA1 and GOA2, GOA2 and GOA3; and wiring portions on two sides of GOA2 overlap with wiring portions of GOA1 and GOA3 respectively, and one via hole H is set in each of overlapping regions, so as to electrically connect wiring portions of two GOAs adjacent to each other. In such a manner that adjacent GOA units are made to overlap with each other and are electrically connected by using a via hole, as compared with the mode in which a conducting wire is used for electric connection, more GOA units can be provided in a unit length along a direction perpendicular to gate lines, and as a result, more gate lines can be provided in a unit length. Thus, the density of gate lines is increased, and in turn, the display resolution is improved.

Figure 5:
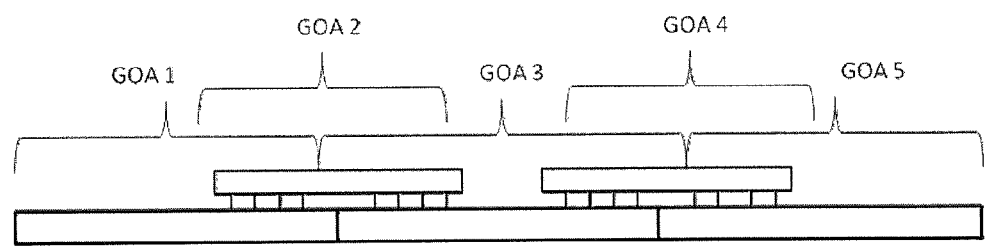
FIG. 5 is a sectional view of the GOA layout structure shown in FIG. 4, taken along the direction of B-B'.

It is to be noted that, a GOA2's wiring portion may be provided on different layers from the GOA2's logic portion (e.g., the sectional shape of GOA2 is a folded-line shape, as shown in FIG. 3), and may also be provided on the same layer as its logic portion (namely, the sectional shape of GOA2 is a straight-line shape, as shown in FIG. 5). For example, when a GOA2's wiring portion is provided on the same layer as its logic portion, GOA1 and GOA3 may be placed side by side, and GOA2 is disposed in a layer above GOA1 and GOA3 and is located between the two, as shown in FIG. 5; or, an insulating layer may be provided between GOA1 and GOA3, so as to fill the gap between the two and to form a flat top surface, and at least a part of GOA2 is disposed in a layer over the insulating layer between GOA1 and GOA3. Structures shown in figures are merely used for exemplary description, and embodiments of the invention are not limited thereto.

Figure 6:
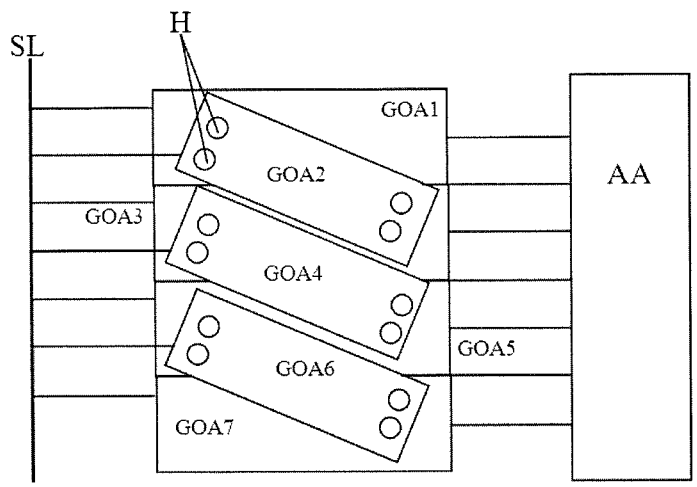
FIG. 6 is a schematic view illustrating a GOA layout structure of an array substrate provided by a further embodiment of the invention.

In order to increase the flexibility of GOA layout structure, as a modification of FIG. 2, in an embodiment, the array substrate may include: one GOA unit of the first GOA unit group is obliquely placed. For example, as shown in FIG. 6, GOA units are joined, head-to-end, through respective two via holes H, and in FIG. 6, an odd-numbered GOA unit is horizontally placed, and an even-numbered GOA unit is located over its adjacent GOA units and is obliquely placed. Of course, an even-numbered GOA unit can also be provided with one end thereof located above one GOA unit adjacent to it, and with other end thereof located below another GOA unit adjacent to it; and two adjacent odd-numbered GOA units may be placed side by side as shown in FIG. 6 so as to gain a larger density of gate lines, or may also be arranged to be spaced at a certain distance according to actual requirements. However, embodiments of the invention are not limited thereto.

Figure 8A:
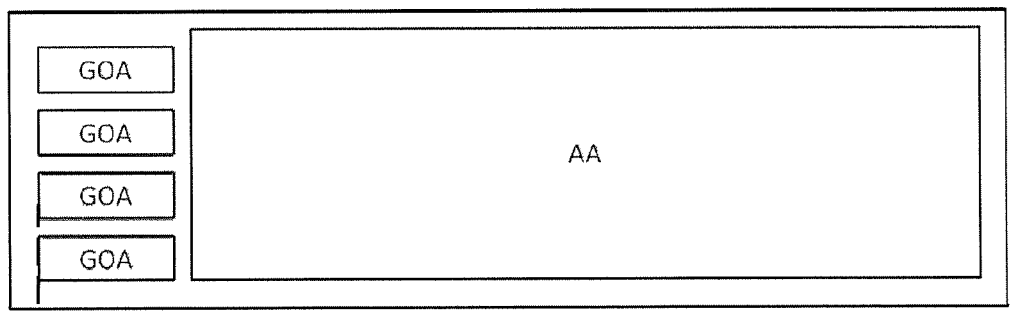
FIG. 8a is a structurally schematic view illustrating a display panel with the GOA layout structure shown in FIG. 1.
Figure 8B:
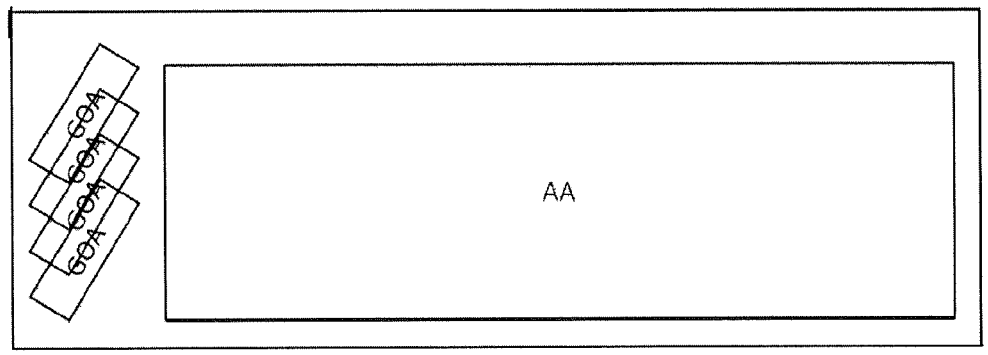
FIG. 8b is a structurally schematic view illustrating a display panel provided by an embodiment of the invention.

In another embodiment, the array substrate may include: two GOA units of the first GOA unit group are obliquely placed, for example, an acute angle is formed between the GOA unit and the horizontally extending direction of a gate line. For example, two GOA units of the first GOA unit group are uniform in the direction and angle for the oblique placement. As shown in FIG. 4 and FIG. 5, the wiring portion of GOA2 has an overlapping region with the wiring portions of GOA1 and GOA3, respectively, at least two via holes H are provided in each overlapping region; GOA2's wiring portion is provided on the same layer as its logic portion, GOA1 and GOA3 are placed side by side, and GOA2 is obliquely placed in a layer above GOA1 and GOA3 and is located between the two. As compared with a horizontally placing mode, as shown in FIG. 8a and FIG. 8b, the width occupied by a GOA unit along the gate-line direction can be reduced by this obliquely placing mode, so that an effect of narrow-frame display panel can be achieved. In addition, as GOA units that are placed obliquely may have an overlapping region therebetween and are electrically connected through a via hole, in a direction perpendicular to gate lines, it is still possible that the display resolution is improved by providing more GOA units in a unit of length.

Figure 7:
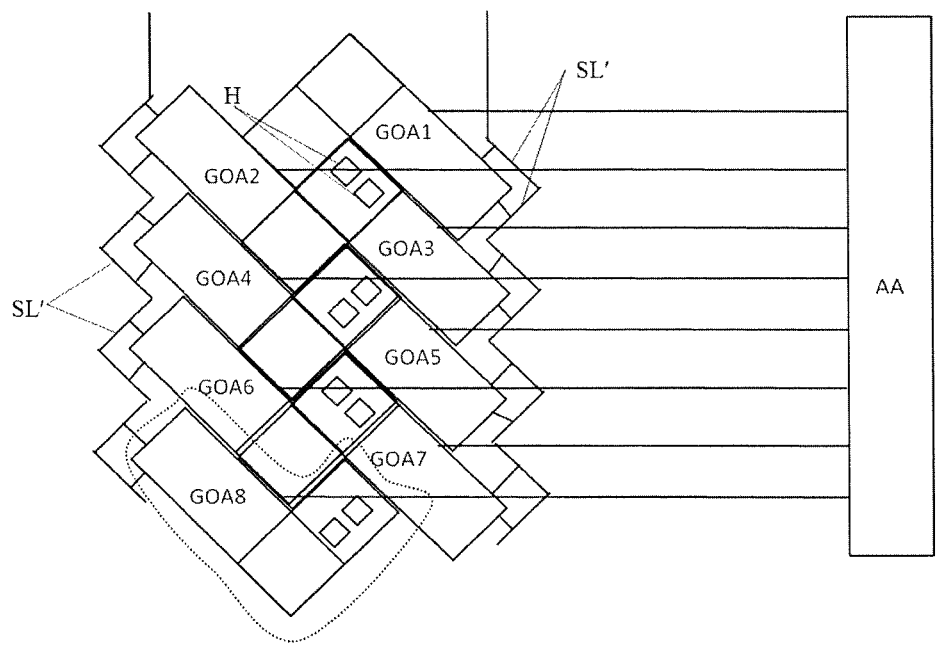
FIG. 7 is a schematic view illustrating a GOA layout structure of an array substrate provided by a still further embodiment of the invention.

In an embodiment, the plurality of GOA unit groups may further include a second GOA unit group, and two GOA units of the second GOA unit group are electrically connected through a conducting wire. Due to the use of the first GOA unit group and the second GOA unit group, two adjacent GOA units may be electrically connected to each other through a via hole or a conducting wire. This makes the placing mode of GOA units more flexible. For example, between GOA units, such a way that a via-hole connection alternates with a wire connection may be adopted, namely, such a way that the first GOA unit group and the second GOA unit group alternate with each other. As shown in FIG. 7, GOA2 and GOA3, GOA4 and GOA5, and GOA6 and GOA7 are connected by using a via hole, respectively (namely, they form first GOA unit groups, respectively); GOA1 and GOA2, GOA3 and GOA4, GOA5 and GOA6, and GOA7 and GOA8 are connected by using a conducting wire, respectively (namely, they form second GOA unit groups, respectively). This layout mode makes the space occupied by GOA units in a direction perpendicular to gate lines smaller, and thus, more GOA units can be provided in a direction perpendicular to gate lines so as to increase the density of gate lines. In turn, the display resolution is improved.

In one example, the array substrate may further include a curved conducting wire for example, a curved signal line, connected to the obliquely-placed GOA unit or units. As shown in FIG. 4 and FIG. 7, obliquely-placed GOA units may be connected to a curved signal line SL'. As compared with the use of a common, linearly-extending conducting wire, for the use of the cured conducting wire, when it is acted upon by an external force, only a component of the external force rather than the full force acts upon the curved conducting wire, and this makes it not easy for the wire to be damaged. Therefore, the stability of the display panel can be further improved by use of the curved conducting wire, and the way of employing a curved conducting wire is especially suitable for flexible display screens. It is to be noted that, signal lines in drawings are merely for exemplary description, in practice, more than one signal line for each of the GOA units may be provided, and the signal line of each GOA unit may include VGL, VGH, clock signal line and so on.

In an example, a sectional shape and/or a planar shape of the GOA units is a folded-line shape. For example, the folded-line shape is a concave shape, and as denoted by a dotted-line part in FIG. 3, the sectional shape of GOA2, GOA4 and so on is a concave shape. For example, the folded-line shape is an L shape, and as denoted by a dotted-line part in FIG. 7, the planar shape of each GOA unit is an L shape. As such, the flexibility of the placing mode of GOA units is further increased. Certainly, embodiments of the invention are not limited thereto. For example, both the sectional shape and the planar shape of the GOA units may be a folded-line shape.

At least one embodiment of the invention provides another array substrate. This array substrate includes a plurality of GOA units that are placed obliquely. As compared with a horizontally placing mode, as shown in FIG. 8a and FIG. 8b, the width occupied by a GOA unit along the gate-line direction can also be reduced by the oblique placement, so that an effect of narrow-frame display panel can be achieved.

In various embodiments, each of the obliquely-placed GOA units and adjacent GOA unit thereof may be electrically connected through a conducting wire or a via hole; or each of the obliquely-placed GOA unit and adjacent GOA units thereof are electrically connected through a conducting wire and a via hole. Each of the obliquely-placed GOA unit and GOA units adjacent to it may be electrically connected to each other through via holes and/or conducting wires, and this makes it possible for the obliquely placing mode of GOA units to be more flexible. For example, between GOA units, such a way that a via-hole connection alternates with a wire connection may be adopted, namely, such a way that the first GOA unit group and the second GOA unit group alternate with each other, as shown in FIG. 7. Details are omitted here. In addition, when an obliquely-placed GOA unit and a GOA unit adjacent to it are connected through a via hole, these two GOA units may overlap with each other. Thus, the intensity of gate lines can be increased, and in turn, the display resolution is improved. In an example, at least two via holes may be employed for the connection between adjacent GOA units, and when a via hole is damaged under the action of an external force, the adjacent GOA units may also be connected through other via hole. As such, the connection path between the adjacent GOA units is supplemented, and thus the stability of the display panel is improved. Especially in a flexible display screen, the anti-bending capability of the GOA units can be enhanced by use of at least two via holes for the connection between adjacent GOA units, and then, the anti-bending capability of the flexible display screen is enhanced.

In one example, the array substrate may further include: a curved conducting wire connected to the obliquely-placed GOA units, for example, a curved signal line. As shown in FIG. 4 and FIG. 7, the obliquely-placed GOA units may be connected to a curved signal line SL'. As compared with the use of a common conducting wire, for the use of the cured wire, when it is acted upon by an external force, only a component of the external force rather than the full force acts upon the curved conducting wire, and this makes it not easy for the wire to be damaged. Therefore, the stability of the display panel can be further improved by use of the curved conducting wire, and the way of employing a curved conducting wire is especially suitable for flexible display screens.

It is to be noted that, in the array substrate provided by at least one embodiment of the invention, regarding via holes, obliquely placing mode and arrangement of curved conducting wires and relevant descriptions, reference may be made to the above description, and repetitions are omitted here.

At least one embodiment of the invention provides a display device, and the display device comprises the array substrate as stated in any of the above embodiments. The display device may be a liquid crystal panel, an electronic paper, an OLED panel, a cell phone, a tablet computer, a television, a display, a notebook computer, a digital photo frame, a navigator or any other product or component having a display function.

At least one embodiment of the invention provides a GOA layout method, and the method comprises: providing a plurality of GOA unit groups, each of which includes two adjacent GOA units, the plurality of GOA unit groups includes a first GOA unit group, two GOA units of the first GOA unit group have an overlapping region with at least one via hole provided therein, and electrically connecting the two GOA units of the first GOA unit group through the at least one via hole.

In various embodiments, at least two via holes may be provided in the overlapping region.

In various embodiments, the GOA layout method may further include: obliquely placing one GOA unit or two GOA units of the first GOA unit group.

In an embodiment, the plurality of GOA unit groups may further include a second GOA unit group, and two GOA units of the second GOA unit group are electrically connected through a conducting wire.

In an embodiment, the GOA layout method may further include: connecting the obliquely-placed GOA unit or units to a curved conducting wire.

In the GOA layout method provided by at least one embodiment of the invention, regarding via holes, obliquely placing mode and arrangement of curved conducting wires and relevant descriptions, reference may be made to the above description, and repetitions are omitted here.

In summary, in at least one embodiment of the invention, a via hole is used for the electric connection between adjacent GOA units. As compared with the mode of wire connection, GOA units may overlap with each other, so the density of gate lines can be increased, and thus the display resolution can be improved. In at least one embodiment of the invention, at least two via holes may be employed for the connection between adjacent GOA units, which supplements the connection path between the adjacent GOA units, so the stability of a display panel is improved. In at least one embodiment of the invention, GOA units can be placed obliquely, so an effect of narrow-frame display panel can be achieved, and on the other hand, more curved conducting wires can also be utilized, to improve the stability of a display panel.

What are described above is related to the illustrative embodiments of the disclosure only and not limitative to the scope of the disclosure; the scopes of the disclosure are defined by the accompanying claims.

The invention claimed is:

1. An array substrate, comprising a plurality of GOA unit groups, each of which comprises two adjacent GOA units, wherein the plurality of GOA unit groups comprises a first GOA unit group, two GOA units of the first GOA unit group comprise an overlapping region with at least one via hole provided therein, and the two GOA units of the first GOA unit group are electrically connected through the at least one via hole.

2. The array substrate as claimed in claim 1, wherein at least two via holes are provided in the overlapping region.

3. The array substrate as claimed in claim 1, wherein wiring portions of the two GOA units of the first GOA unit group overlap with each other in the overlapping region.

4. The array substrate as claimed in claim 2, wherein wiring portions of the two GOA units of the first GOA unit group overlap with each other in the overlapping region.

5. The array substrate as claimed in claim 1, wherein one GOA unit or two GOA units of the first GOA unit group is or are placed in an oblique mode.

6. The array substrate as claimed in claim 5, wherein the plurality of GOA unit groups further comprises a second GOA unit group, and two GOA units of the second GOA unit group are electrically connected through a conducting wire.

7. The array substrate as claimed in claim 5, wherein the obliquely-placed GOA unit or units is or are connected to a curved conducting wire.

8. The array substrate as claimed in claim 6, wherein the obliquely-placed GOA unit or units is or are connected to a curved conducting wire.

9. The array substrate as claimed in claim 7, wherein a sectional shape and/or a planar shape of the GOA unit are/is a folded-line shape.

10. The array substrate as claimed in claim 8, wherein a sectional shape and/or a planar shape of the GOA unit are/is a folded-line shape.

11. The array substrate as claimed in claim 9, wherein the folded-line shape is a concave shape or an L shape.

12. The array substrate as claimed in claim 10, wherein the folded-line shape is a concave shape or an L shape.

13. A display device, comprising an array substrate, wherein the array substrate comprises a plurality of GOA unit groups, each of which comprises two adjacent GOA units, the plurality of GOA unit groups comprises a first GOA unit group, two GOA units of the first GOA unit group comprise an overlapping region with at least one via hole provided therein, and the two GOA units of the first GOA unit group are electrically connected through the at least one via hole.

14. The display device as claimed in claim 13, wherein at least two via holes are provided in the overlapping region.

15. The display device as claimed in claim 13, wherein wiring portions of the two GOA units of the first GOA unit group overlap with each other in the overlapping region.

16. A GOA layout method, comprising:
   providing a plurality of GOA unit groups, each of which comprises two adjacent GOA units, wherein the plurality of GOA unit groups comprises a first GOA unit group, two GOA units of the first GOA unit group comprise an overlapping region with at least one via hole provided therein, and
   electrically connecting the two GOA units of the first GOA unit group through the at least one via hole.

17. The GOA layout method as claimed in claim 16, wherein at least two via holes are provided in the overlapping region.

18. The GOA layout method as claimed in claim 16, further comprising:
   obliquely placing one GOA unit or two GOA units of the first GOA unit group.

19. The GOA layout method as claimed in claim 18, wherein the plurality of GOA unit groups further comprises a second GOA unit group, and two GOA units of the second GOA unit group are electrically connected through a conducting wire.

20. The GOA layout method as claimed in claim 18, further comprising:
   connecting the obliquely-placed GOA unit or units to a curved conducting wire.

* * * * *